US010034416B2

(12) United States Patent
Pautsch et al.

(10) Patent No.: US 10,034,416 B2
(45) Date of Patent: *Jul. 24, 2018

(54) TRANSVERSE COOLING SYSTEM AND METHOD

(71) Applicant: Cray Inc., Seattle, WA (US)

(72) Inventors: Gregory W. Pautsch, Hayward, WI (US); Eric D. Lakin, Chippewa Falls, WI (US)

(73) Assignee: Cray Inc., Seattle, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/887,275

(22) Filed: Oct. 19, 2015

(65) Prior Publication Data

US 2016/0044828 A1    Feb. 11, 2016

Related U.S. Application Data

(63) Continuation of application No. 13/681,188, filed on Nov. 19, 2012, now Pat. No. 9,167,726.

(60) Provisional application No. 61/561,240, filed on Nov. 17, 2011.

(51) Int. Cl.
*H05K 7/20*    (2006.01)

(52) U.S. Cl.
CPC ..... *H05K 7/20781* (2013.01); *H05K 7/20836* (2013.01); *H05K 7/20572* (2013.01); *H05K 7/20736* (2013.01)

(58) Field of Classification Search
CPC ......... H05K 7/20736; H05K 7/20781; H05K 7/20772; H05K 7/20763; H05K 7/20572; H05K 7/20581; H05K 7/20636; H05K 7/20645
USPC .................. 361/679.46–679.54, 688–723
See application file for complete search history.

(56) References Cited

U.S. PATENT DOCUMENTS

| | | | | |
|---|---|---|---|---|
| 9,167,726 | B2* | 10/2015 | Pautsch | H05K 7/20727 |
| 2009/0122483 | A1* | 5/2009 | Hall | H05K 7/2079 361/688 |
| 2009/0260777 | A1* | 10/2009 | Attlesey | G06F 1/20 165/67 |
| 2010/0149754 | A1* | 6/2010 | Chapel | H05K 7/20745 361/696 |
| 2011/0157829 | A1* | 6/2011 | Wormsbecher | H05K 7/1497 361/701 |

* cited by examiner

*Primary Examiner* — Zachary M Pape
(74) *Attorney, Agent, or Firm* — Craig J. Lervick; Larkin Hoffman Daly & Lindgren, Ltd.

(57) ABSTRACT

A system and method for cooling a plurality of electronics cabinets having horizontally positioned electronics assemblies. The system includes at least one blower configured to direct air horizontally across the electronics assemblies, and at least one intercooler configured to extract heat from the air flow such that the system is room neutral, meaning that the ambient temperature remains constant during operation of the system. A plurality of chassis backplanes and power supplies may also include an intercooler, wherein the intercoolers are electronically controlled such that the system is room neutral.

16 Claims, 13 Drawing Sheets

TRANSVERSE COOLING SYSTEM AND METHOD

CLAIM OF PRIORITY

This application claims priority to U.S. patent application Ser. No. 13/681,188 filed Nov. 12, 2012, which claimed the benefit of U.S. Provisional Patent Application Ser. No. 61/561,240 filed Nov. 17, 2011 entitled Transverse Cooling System and Method.

GOVERNMENT RIGHTS

This invention was made with U.S. Government support under Agreement No. HR0011-07-9-0001 awarded by DARPA. The U.S. Government has certain rights in this invention.

FIELD OF THE INVENTION

The present invention is related to systems for cooling electronics, and more particularly to cabinet mounted electronics assemblies such as rack mounted circuit boards.

BACKGROUND INFORMATION

Conventionally, electronics cabinets such as those with rack mounted electronics, such as circuit boards, are cooled by directing cooled air vertically up through the cabinet. The cooled air typically enters the cabinet at or near the floor and the heated air exits at or near the top of the cabinet. Circuit boards are arranged vertically such that air flows bottom to top along the surfaces of the circuit boards, taking advantage of the fact that hot air rises.

Cabinets including electronics that are cooled in this manner exhibit a significant caloric rise from bottom to top as the circulated air heats draws heat from each of the electronics in its path. Notably, the distance the air travels vertically through a tall cabinet significantly reduces the cooling efficiency of the upper electronics. Moreover, the cooling efficiency drops further due to the pressure drop from the bottom to the top of the cabinet.

In addition, such a cooling approach is often complex and expensive. Air conditioning may be needed to cool the air before it enters the cabinet. If the heat rise of the circulated air up through the cabinet is large, intercooler assemblies may be placed between electronics assemblies to extract heat from the vertically directed air between each assembly. Intercooler assemblies sometimes include a refrigerant or a liquid such as water to aid in extracting heat from the air passing through the intercooler assembly. Such approaches increase the heat generated by the cabinet, further reducing the power usage efficiency (PUE) of the unit.

What is needed is a system and method that addresses these issues and other issues that will become apparent in reading below.

SUMMARY OF THE INVENTION

The invention achieves technical advantages as a room neutral electronics system, including horizontally circulated air through one or more vertically positioned intercoolers. The ambient air remains neutral/constant during operation of the electronics system.

DETAILED DESCRIPTION OF THE INVENTION

In the following detailed description of the preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

FIGS. 1-9 depict various embodiments of room neutral electronics systems according to preferred embodiments of the invention.

Figure 1:
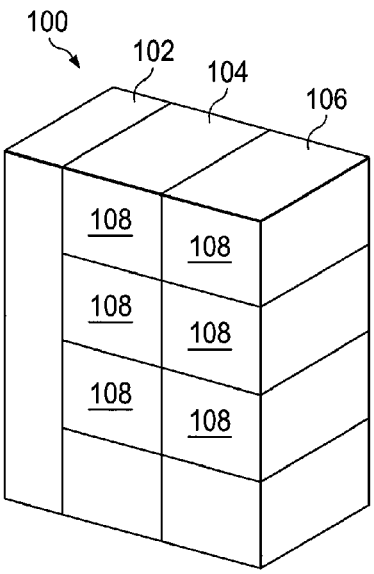
FIG. 1 illustrates an electronics system with transverse cooling.

An electronics system with transverse cooling is shown in FIG. 1. In electronics system 100 of FIG. 1, a blower system 102 blows air horizontally across electronics assemblies positioned in cabinets 104 and 106. In the example shown, each cabinet includes three electronics chassis 108. Each electronics chassis 108 includes one or more electronics assemblies (not shown) oriented substantially horizontally in chassis 108. In addition, each chassis 108 and each cabinet 104 is open to the first and second side to the extent necessary to receive air and direct that air across each of the plurality of electronics assemblies.

In the embodiment shown in FIG. 1, blower system 102 is positioned adjacent to the first side of the first cabinet and the second cabinet is positioned on the opposite side of the first cabinet. The electronics assemblies are cooled by actuating the blower system such that blower system 102 directs air into the first cabinet. The air flows substantially horizontally through the side of the first cabinet 104 and across each of the plurality of electronics assemblies within the first cabinet 104 before entering the second cabinet 106 and flowing substantially horizontally across each of the plurality of electronics assemblies of the second cabinet 106 before exiting the second cabinet 106.

In another embodiment, electronics assemblies are cooled by actuating the blower system such that blower system 102 draws air from the first cabinet. The air flows substantially horizontally through the side of the second cabinet 106 and across each of the plurality of electronics assemblies within the second cabinet 106 before entering the first cabinet 104 and flowing substantially horizontally across each of the plurality of electronics assemblies of the first cabinet 104.

Figure 2A:
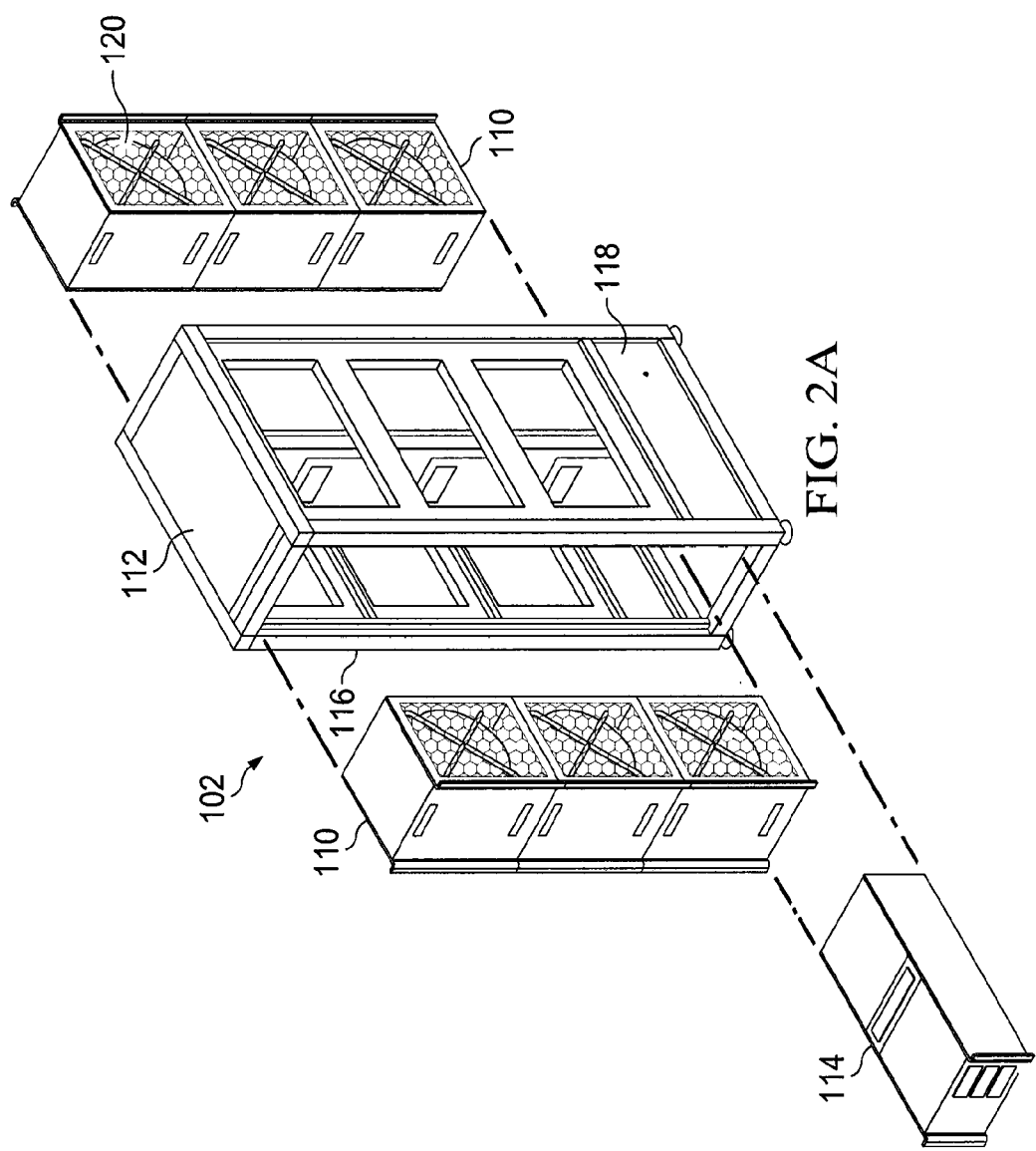
FIG. 2A is an exploded view of a blower assembly that can be used in the electronics systems of FIG. 1.

A blower system 102 is shown in FIG. 2A. In the blower system of FIG. 2A, one or more blower assemblies 110 are positioned in a frame assembly 112. In the embodiment shown in FIG. 2A, each blower assembly 110 includes three blowers 120 stacked vertically. A power unit 114 is mounted under blower assembly 110. In one embodiment, blower system also includes a side panel inlet/exhaust 116 used to prevent objects from entering blower assembly 110 and a frame joiner 118 used to connect blower system 102 to a respective cabinet.

Figure 2B:
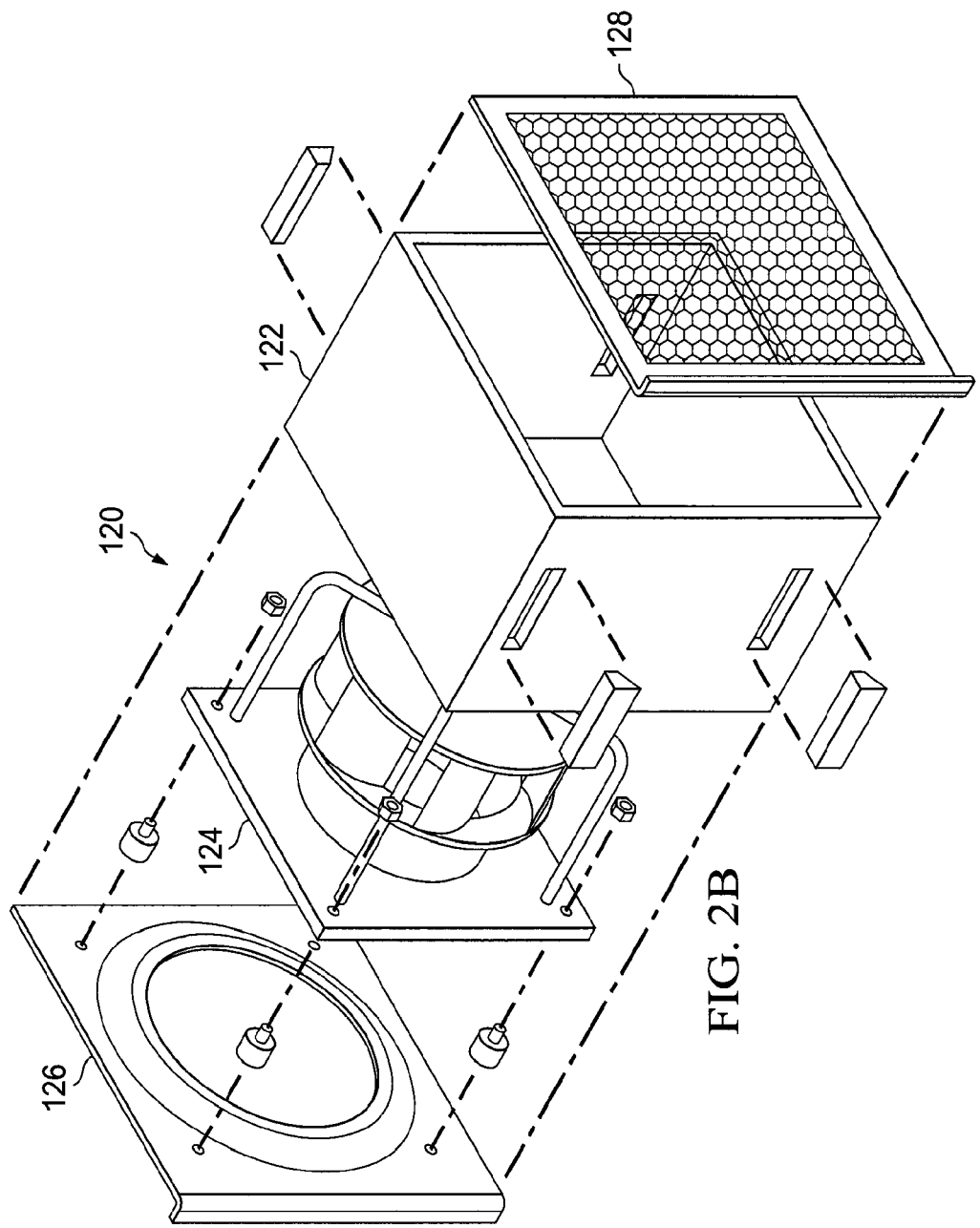
FIG. 2B illustrates an exploded view of a fan assembly that can be used in the blower assembly of FIG. 2A.

FIG. 2B provides an exploded view of one embodiment of a blower 120 that can be mounted in blower assembly 110. Blower 120 includes a blower frame 122, a fan 124, a cover 126 and a grill 128. In one embodiment, blower 120 is designed to be hot-swappable and is wired to indicate failure.

Figure 3:
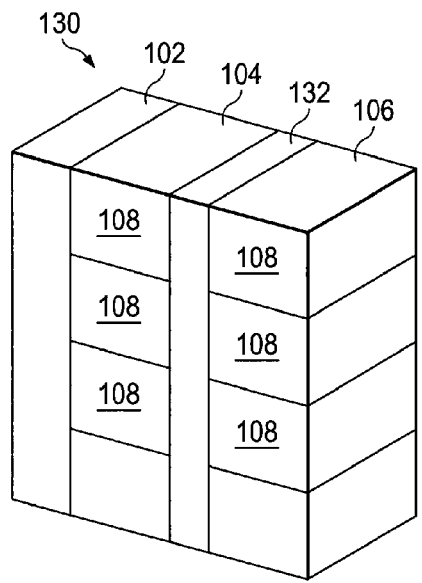
FIG. 3 illustrates an electronics system with an alternate transverse cooling approach.
Figure 9:
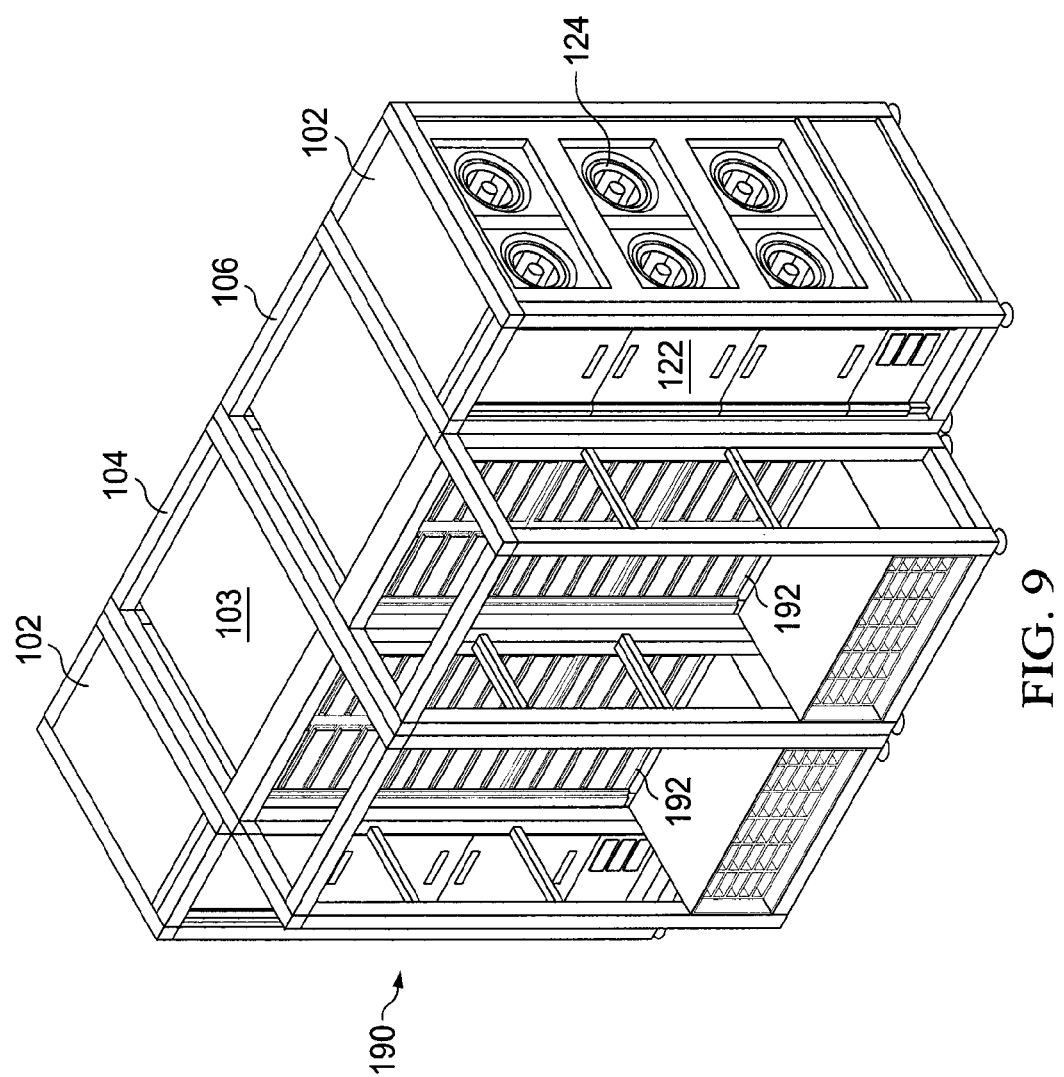
FIG. 9 illustrates an electronics system with yet another transverse cooling approach.

Another example electronics system with transverse cooling is shown in FIG. 3. In electronics system 130 of FIG. 3, a blower system 102 blows air horizontally across electronics assemblies positioned in cabinets 104 and 106. Each electronics assembly is oriented substantially horizontally in cabinet 104 and 106, as shown in FIG. 9 which will be described in more detail shortly. In addition, each cabinet 104 and 106 is open to the first and second side to the extent necessary to receive air and direct that air across each of the plurality of electronics assemblies. An intercooler 132 is positioned between the first cabinet 104 and the second cabinet 106 and is configured to cool air as it passes through intercooler 132 before entering the next cabinet 106. Intercooler 132, as implemented and described in many embodiments of the invention hereafter, is preferably a coiled assembly configured to draw heat from air circulated therethrough into a fluid circulated through the coiled assembly, as will be discussed further in regards to FIGS. 11-14.

In the embodiment shown in FIG. 3, blower system 102 is positioned adjacent to the first side of the first cabinet 104 and the second cabinet is positioned on the opposite side of the first cabinet. The electronics assemblies are cooled by actuating the blower system such that blower system 102 directs air into the first cabinet. The air flows substantially horizontally through the side of the first cabinet 104 and across each of the plurality of electronics assemblies within the first cabinet 1046 before entering intercooler 132. The air is cooled in intercooler 132 and then passes into the second cabinet 106, flowing substantially horizontally across each of the plurality of electronics assemblies of the second cabinet 106 before exiting the second cabinet 106.

In another embodiment, electronics assemblies in each cabinet 104 and 106 of FIG. 3 are cooled by actuating the blower system such that blower system 102 draws air from the first cabinet. The air flows substantially horizontally through the side of the second cabinet 106 and across each of the plurality of electronics assemblies within the second cabinet 106 before entering intercooler 132. The air is cooled in intercooler 132 and then passes into the first cabinet 104, flowing substantially horizontally across each of the plurality of electronics assemblies of the first cabinet 104, before being drawn into blower 102.

Figure 4:
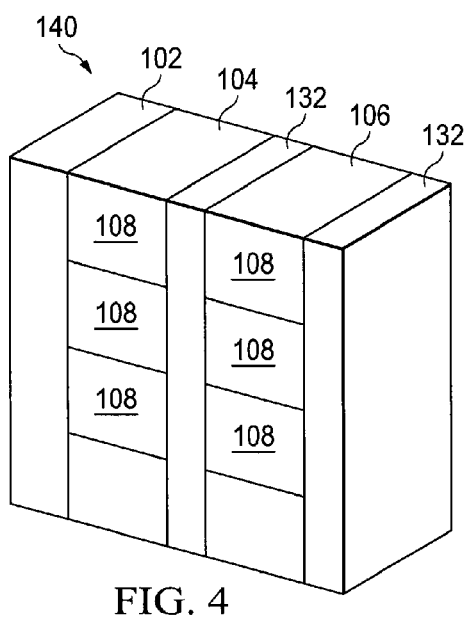
FIG. 4 illustrates an electronics system with yet another transverse cooling approach.

Another example electronics system with transverse cooling is shown in FIG. 4. In electronics system 140 of FIG. 4, a blower system 102 blows air horizontally across electronics assemblies positioned in cabinets 104 and 106. Each electronics assembly is oriented substantially horizontally in respective cabinet 104 and 106. In addition, each cabinet 104 and 106 is open to the first and second side to the extent necessary to receive air and direct that air across each of the plurality of electronics assemblies. An intercooler 132 inserted between the first cabinet 104 and second cabinet 106 and is configured to cool air as it passes through intercooler 132 before entering the next cabinet 106. A second intercooler 132 is configured to cool the air exiting cabinet 106.

In the embodiment shown in FIG. 4, blower system 102 is positioned adjacent to the first side of the first cabinet and the second cabinet is positioned on the opposite side of intercooler 132. The electronics assemblies are cooled by actuating the blower system such that blower system 102 directs air into the first cabinet 104. The air flows substantially horizontally through the side of the first cabinet 104 and across each of the plurality of electronics assemblies within the first cabinet 104 before entering intercooler 132. The air is cooled in intercooler 132 and then passes into the second cabinet 106, flowing substantially horizontally across each of the plurality of electronics assemblies of the second cabinet 106 before exiting the second cabinet and entering intercooler 132.

In another embodiment, electronics assemblies in each cabinet 104 and 106 of FIG. 4 are cooled by actuating the blower system such that blower system 102 draws air from the first cabinet 104. The air is drawn through intercooler 132. The air then flow substantially horizontally through the side of the second cabinet 106 and across each of the plurality of electronics assemblies within the second cabinet 106 before entering intercooler 132. The air is cooled in intercooler 132 and then passes into the first cabinet 104, flowing substantially horizontally across each of the plurality of electronics assemblies of the first cabinet 104 before being drawn into blower 102.

Figure 5:
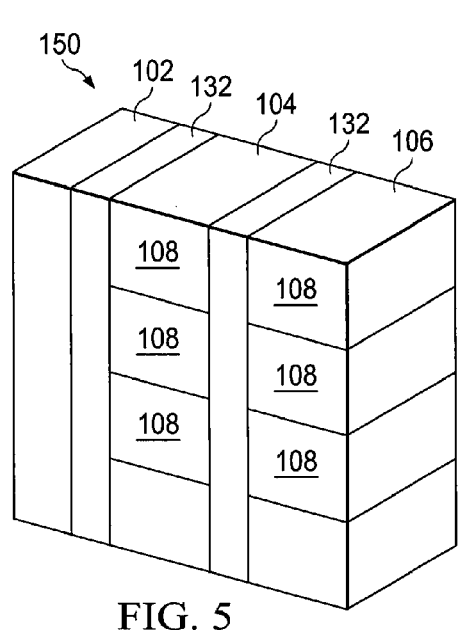
FIG. 5 illustrates an electronics system with yet another transverse cooling approach.

Another example electronics system with transverse cooling is shown in FIG. 5. In electronics system 150 of FIG. 5, a blower system 102 blows air horizontally across electronics assemblies positioned in cabinets 104 and 106. Each electronics assembly is oriented substantially horizontally in the respective cabinet 104 and 106. In addition, each cabinet 104 and 106 is open to the first and second side to the extent necessary to receive air and direct that air across each of the plurality of electronics assemblies. An intercooler 132 inserted between blower system 102 and cabinet 104 cools air as it passes through intercooler 132. An intercooler 132 inserted between the first cabinet 104 and the second cabinet 106 cools air as it passes through intercooler 132 before entering the next cabinet 106.

In the embodiment shown in FIG. 5, intercooler 132 is located between blower system 102 and cabinet 104. The electronics assemblies in cabinet 104 are cooled by actuating the blower system such that blower system 102 directs air through intercooler 132 into the first cabinet. The air flows substantially horizontally through the side of the first cabinet 104 and across each of the plurality of electronics assemblies within the first cabinet 104 before entering intercooler 132. The air is cooled in intercooler 132 and then passes into the second cabinet 106, flowing substantially horizontally across each of the plurality of electronics assemblies of the second cabinet 106 before exiting the second cabinet.

In another embodiment, electronics assemblies in each cabinet 104 of FIG. 5 are cooled by actuating the blower system such that blower system 102 draws air through intercooler 132 from the first cabinet 104. The air is drawn initially through intercooler 132 from cabinet 106. The air through cabinet 106 flows substantially horizontally through the side of the second cabinet 106 and across each of the plurality of electronics assemblies within the second cabinet 106 before entering intercooler 132. The air is cooled in intercooler 132 and then passes into the first cabinet 104, flowing substantially horizontally across each of the plurality of electronics assemblies of the first cabinet 104, before being drawn into blower 102.

Figure 6:
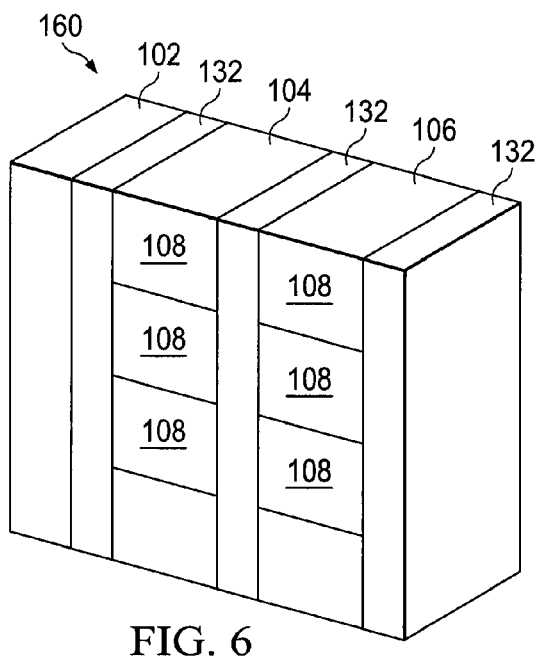
FIG. 6 illustrates an electronics system with yet another transverse cooling approach.

Another example electronics system with transverse cooling is shown in FIG. 6. In electronics system 160 of FIG. 6, an additional intercooler 132 is added to system 160 of FIG. 5. In one embodiment, blower system 102 blows air horizontally across electronics assemblies positioned in cabinets 104 and 106. Each electronics assembly is oriented substantially horizontally in respective cabinet 104 and 106. In addition, each cabinet 104 and 106 is open to the first and second side to the extent necessary to receive air and direct that air across each of the plurality of electronics assemblies. An intercooler 1321 inserted between blower system 102 and cabinet 104 cools air as it passes through intercooler 132. An intercooler 132 inserted between the first cabinet 104 and second cabinet 106 cools air as it passes through intercooler 132 before entering the next cabinet 106.

In the embodiment shown in FIG. 6, the third intercooler 132 is added to one side of cabinet 106. In one such embodiment, air blown through cabinet 106 passes through third intercooler 132 before being vented to the room In another embodiment, electronics assemblies in each cabinet 104 and 106 of FIG. 6 are cooled by actuating the blower system such that blower system 102 draws air through intercooler 132 from the first cabinet 104. In such an embodiment, the third intercooler 132 cools the air before passing it on to cabinet 106.

Figure 7:
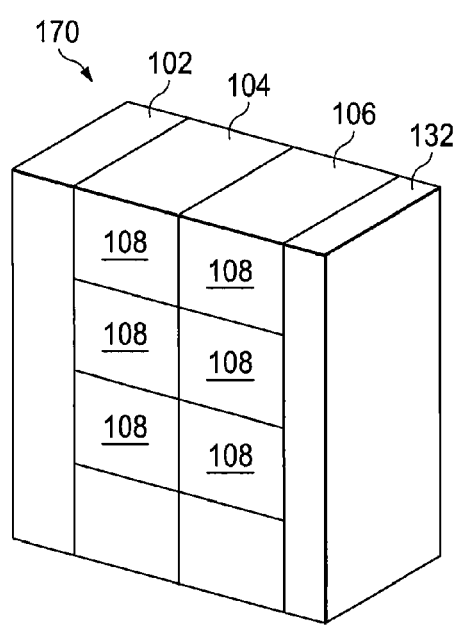
FIG. 7 illustrates an electronics system with yet another transverse cooling approach.

Another example electronics system with transverse cooling is shown in FIG. 7. In electronics system 170 of FIG. 7, a blower system 102 blows air horizontally across electronics assemblies positioned in cabinets 104 and 106. Each electronics assembly is oriented substantially horizontally in respective cabinet 104 and 106. In addition, each cabinet 104 and 106 is open to the first and second side to the extent necessary to receive air and direct that air across each of the plurality of electronics assemblies. An intercooler 132 mounted on the other side of cabinet 106 cools the air exiting cabinet 106.

In the embodiment shown in FIG. 7, blower system 102 is positioned adjacent to the first side of the first cabinet, and the second cabinet is positioned on the opposite side of the first cabinet. The electronics assemblies are cooled by actuating the blower system such that blower system 102 directs air into the first cabinet 104. The air flows substantially horizontally through the side of the first cabinet 104 and across each of the plurality of electronics assemblies within the first cabinet 104 before entering cabinet 106 The air flows substantially horizontally across each of the plurality of electronics assemblies of the second cabinet 106 before exiting the second cabinet and entering intercooler 132.

In another embodiment, electronics assemblies in each cabinet 104 and 106 of FIG. 7 are cooled by actuating the blower system such that blower system 102 draws air from the first cabinet 104. The air is drawn through adjacent intercooler 132. The air then flow substantially horizontally through the side of the second cabinet 106 and across each of the plurality of electronics assemblies within the second cabinet 106 before passing into the first cabinet 104. The air then flows substantially horizontally across each of the plurality of electronics assemblies of the first cabinet 104, before being drawn into blower 102.

Figure 8:
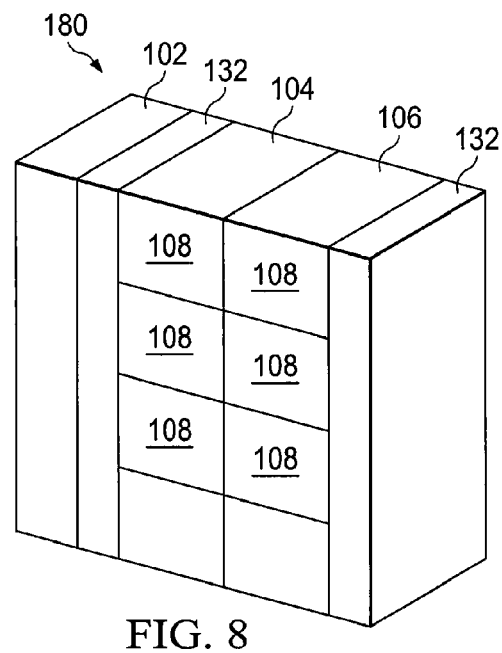
FIG. 8 illustrates an electronics system with yet another transverse cooling approach.

Another example electronics system with transverse cooling is shown in FIG. 8. In electronics system 180 of FIG. 8, an intercooler 132 is placed in between blower 102 and cabinet 104 of FIG. 7.

In the embodiment shown in FIG. 8, intercooler 132 is placed between blower system 102 and first cabinet 104. The electronics assemblies are cooled by actuating the blower system such that blower system 102 directs air through intercooler 132 and into the first cabinet 104. The air flows substantially horizontally through the side of the first cabinet 104 and across each of the plurality of electronics assemblies within the first cabinet 104 before entering cabinet 106. The air flows substantially horizontally across each of the plurality of electronics assemblies of the second cabinet 106 before exiting the second cabinet and entering adjacent intercooler 132.

In another embodiment, electronics assemblies in each cabinet 104 and 106 of FIG. 8 are cooled by actuating the blower system such that blower system 102 draws air through intercooler 132 from the first cabinet 104. The air is drawn through adjacent intercooler 132, flowing substantially horizontally through the side of the second cabinet 106.2 and across each of the plurality of electronics assemblies within the second cabinet 106 before passing into the first cabinet 104. The air then flows substantially horizontally across each of the plurality of electronics assemblies of the first cabinet 104, before being drawn through intercooler 132 and into blower 102.

Another example electronics system with transverse cooling is shown in FIG. 9. In electronics system 190 of FIG. 9, a blower system 102 blows air horizontally across electronics assemblies 192 positioned in respective chassis 103 in each of cabinets 104 and 106. Each electronics assembly 192 is oriented substantially horizontally in its chassis 103 in cabinet 104 and 106. In addition, each cabinet 104 is open to the first and second side to the extent necessary to receive air and direct that air across each of the plurality of electronics assemblies. A second blower system 102 mounted on the other side of cabinet 106 draws air from cabinet 106.

In another embodiment, electronics assemblies in each cabinet 104 and 106 of FIG. 9 are cooled by actuating both blower systems 102 such that the first blower system 102 draws air from the first cabinet 104 while the second blower system 102 blows air into cabinet 106. The air flows substantially horizontally through the side of the second cabinet 106 and across each of the plurality of electronics assemblies within the second cabinet 106 before passing into the first cabinet 104. The air then flows substantially horizontally across each of the plurality of electronics assemblies of the first cabinet 104, before being drawn into first blower 102.

Figure 10:
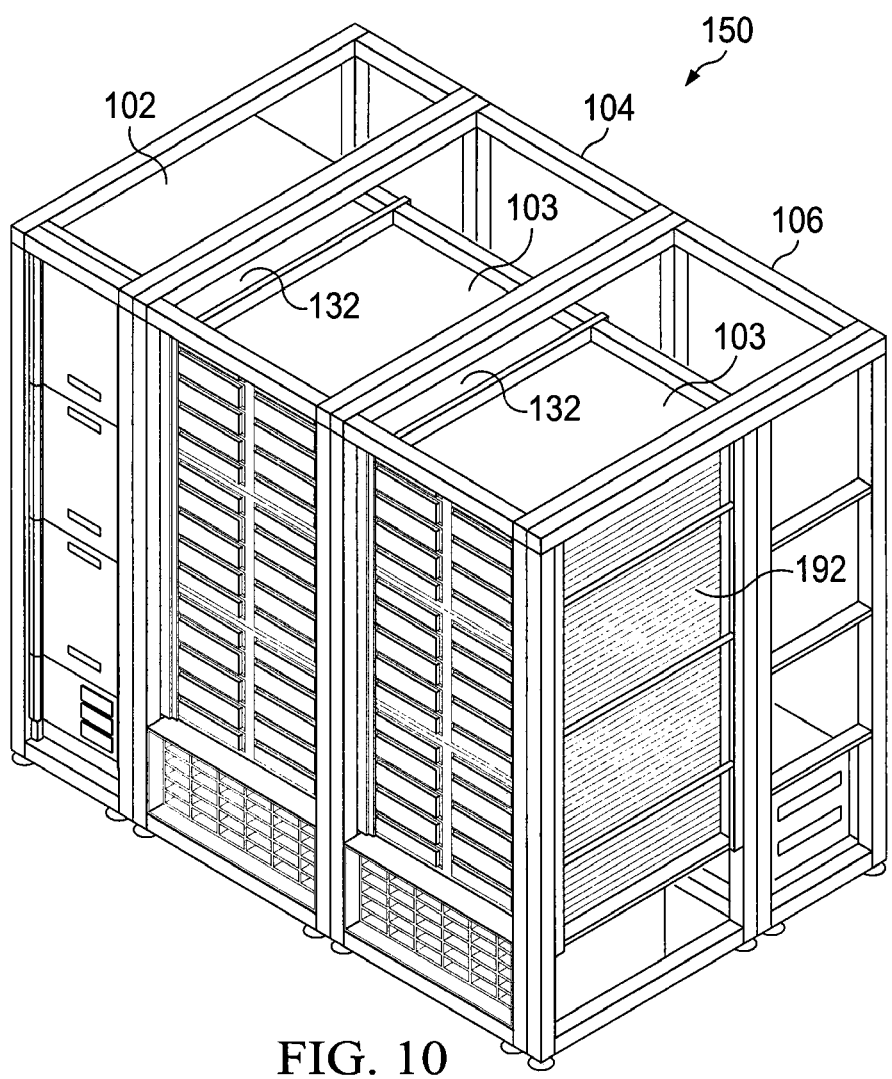
FIG. 10 illustrates one example embodiment of the system of FIG. 5.

A more detailed example of electronics system 150 of FIG. 5 is shown in FIG. 10. In electronics system 150 of FIG. 10, blower system 102 blows air horizontally across each electronics assembly 192 horizontally positioned in respective chassis 103 of cabinets 104 and 106. Each cabinet 104 and 106 has open first and second sides configured to receive and direct cooled air horizontally across each of the plurality of electronic assemblies 192, and expel the heated air. The first intercooler 132 is shown inserted between blower system 102 and first cabinet 104 and cools air as it passes air from the blower system 102 through first intercooler 132. The second intercooler 132 inserted between the first cabinet 104 and second cabinet 106 cools air as it passes through the second intercooler 132 before entering the next cabinet 106.

In another embodiment, electronic assemblies 192 in each cabinet 104 and 106 of FIG. 10 are cooled by actuating the blower system such that blower system 102 draws air through the first intercooler 132 from the first cabinet 104. The air is drawn initially through the second intercooler cabinet 106 and the second intercooler 132. The air through cabinet 106 flows substantially horizontally through the side of the second cabinet 106 and across each of the plurality of electronic assemblies 192 within the second cabinet 106 before entering the second intercooler 132. The air is cooled in the second intercooler 132 and then passes into the first cabinet 104, flowing substantially horizontally across each of the plurality of electronic assemblies 192 of the first cabinet 104, before being drawn into blower 102.

Advantageously, by directing air horizontally across electronics assemblies 192 mounted horizontally in the respective cabinets, the invention takes advantage of the decreased path length of air flow across the cabinets, such that the temperature gradient is reduced across the electronics assemblies 192 resulting in a higher efficiency cooling system. Further, the pressure drop of the cooing air from side to side is reduced, allowing the implementation of less powerful fans and less expensive fans in blower 102 to achieve the desired cooling. The cooling system is configured such that the electronics system is room neutral, meaning the temperature of the air expelled from the cooled system is the same as the ambient air drawn into the cooling system, as will now be described in more detail.

Figure 11:
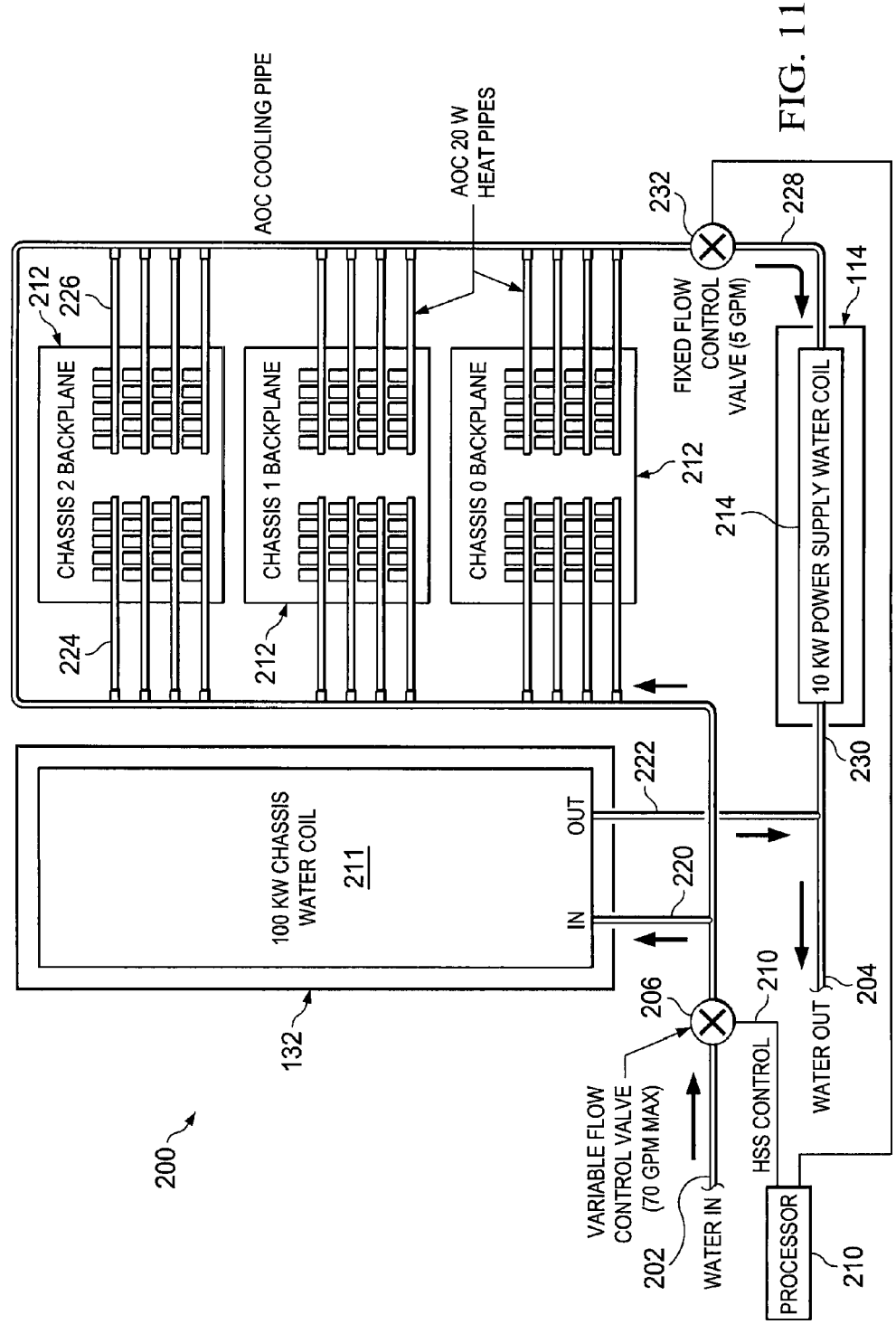
FIG. 11 depicts a system diagram of the cooling system including a map of the circulated cooling fluid.
Figure 12:
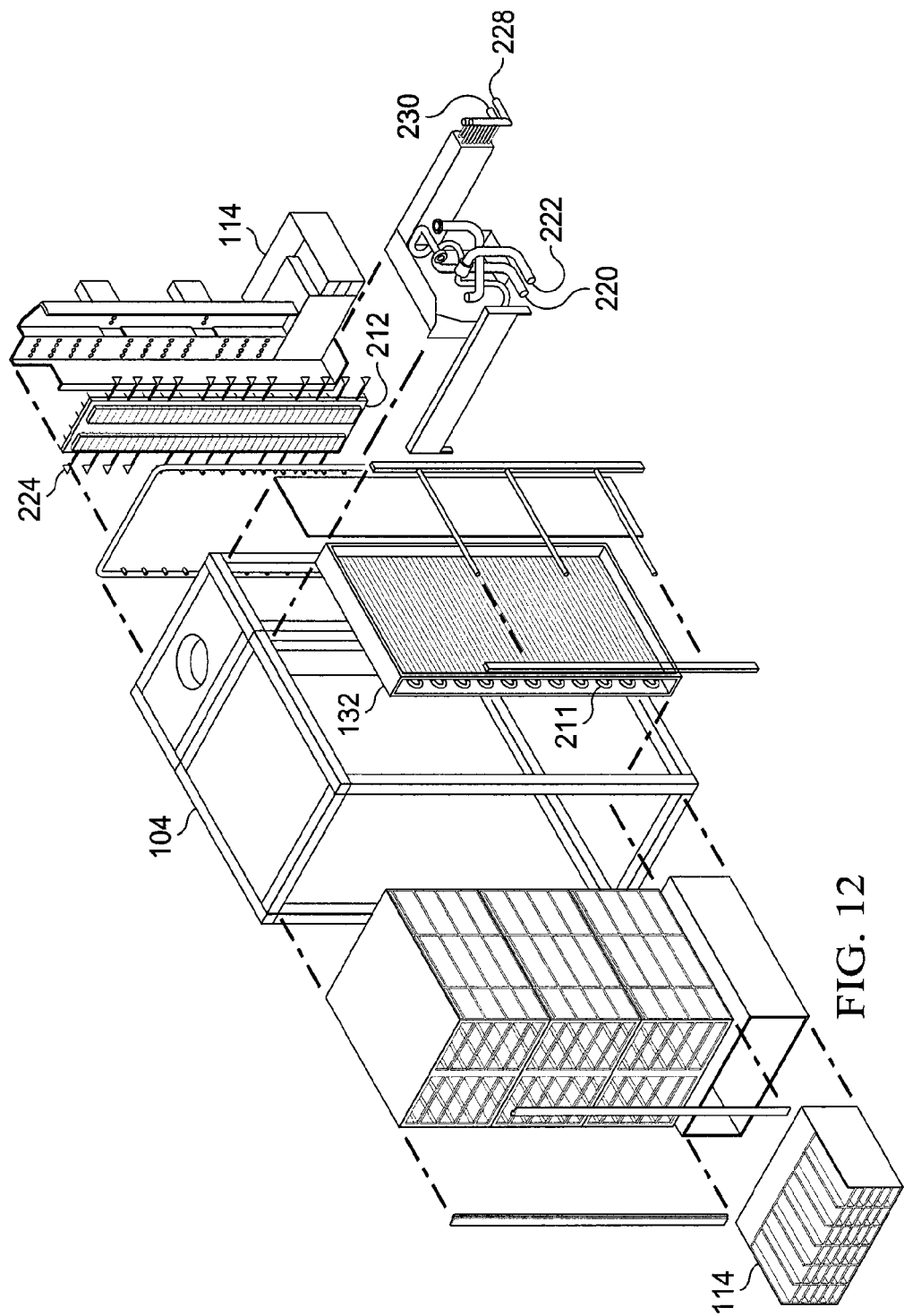
FIG. 12 depicts an exploded view of one cabinet to illustrate the vertically positioned intercooler, the chassis backplane cooling coils, and the power supply cooling coils and the various control valves.

Referring to FIGS. 11-12, FIG. 11 illustrates a system diagram of the fluid cooling system at 200. System 200 is seen to comprise a cooling fluid inlet 202 and a fluid outlet 204, with a variably fluid control valve 206 associated with each cabinet and electronically controlled by a control signal 208 from a process controller 210. Each control valve 206 controls fluid flow to each of coils 211 of the respective intercooler(s) 132, the coils coupled to the associated chassis backplanes 212, and the coil 214 of the respective cabinet power supply. The coil of the intercooler 132 has an inlet 220 coupled to the main fluid loop controlled by valve 206 and an outlet 222, the chassis backplanes 212 each have a plurality of inputs 224 and outlets 226, and the power supply coil 214 has an inlet 228 and outlet 230. The flow of cooling fluid through the chassis backplanes 224 and the power supply coil 214 are controlled by a variable valve 232 also controlled by processor 210.

FIG. 12 illustrates an exploded view one cabinet having a respective intercooler 132, chassis backplanes 224 supporting the plurality of electronic assemblies 192, and the associated power supply unit 114 partitioned into 2 parts as shown. Collectively, the coils of these subsystems draw all heat generated by the electronics systems 192 and the power supply unit 114 such that the system is room neutral.

Figure 13:
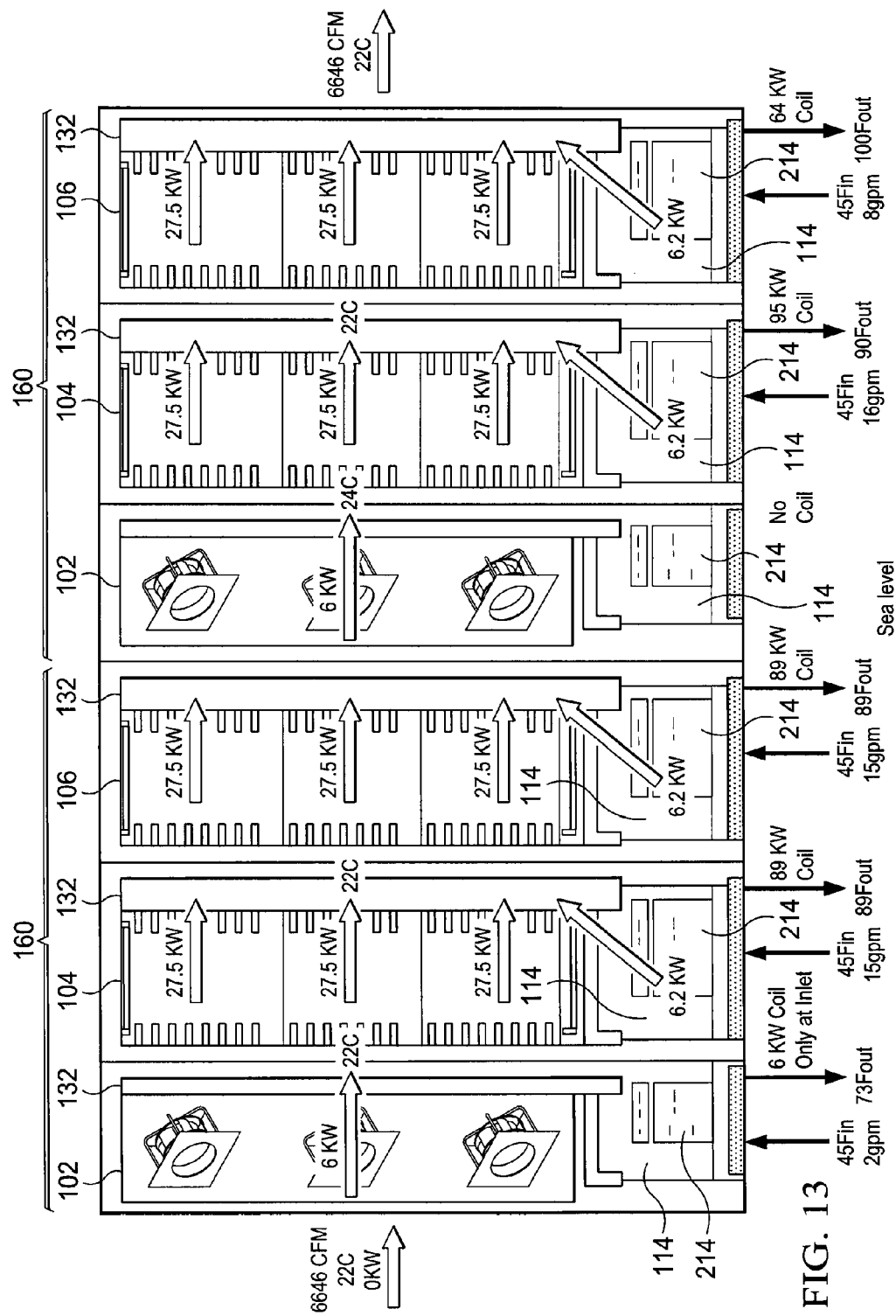
FIGS. 13 and 14 illustrate air flow through an electronics system comprising four electronics cabinets, for two different ambient conditions, whereby the electronics system is room neutral such that the ambient temperature is not increased during operation of the electronics system.
Figure 14:
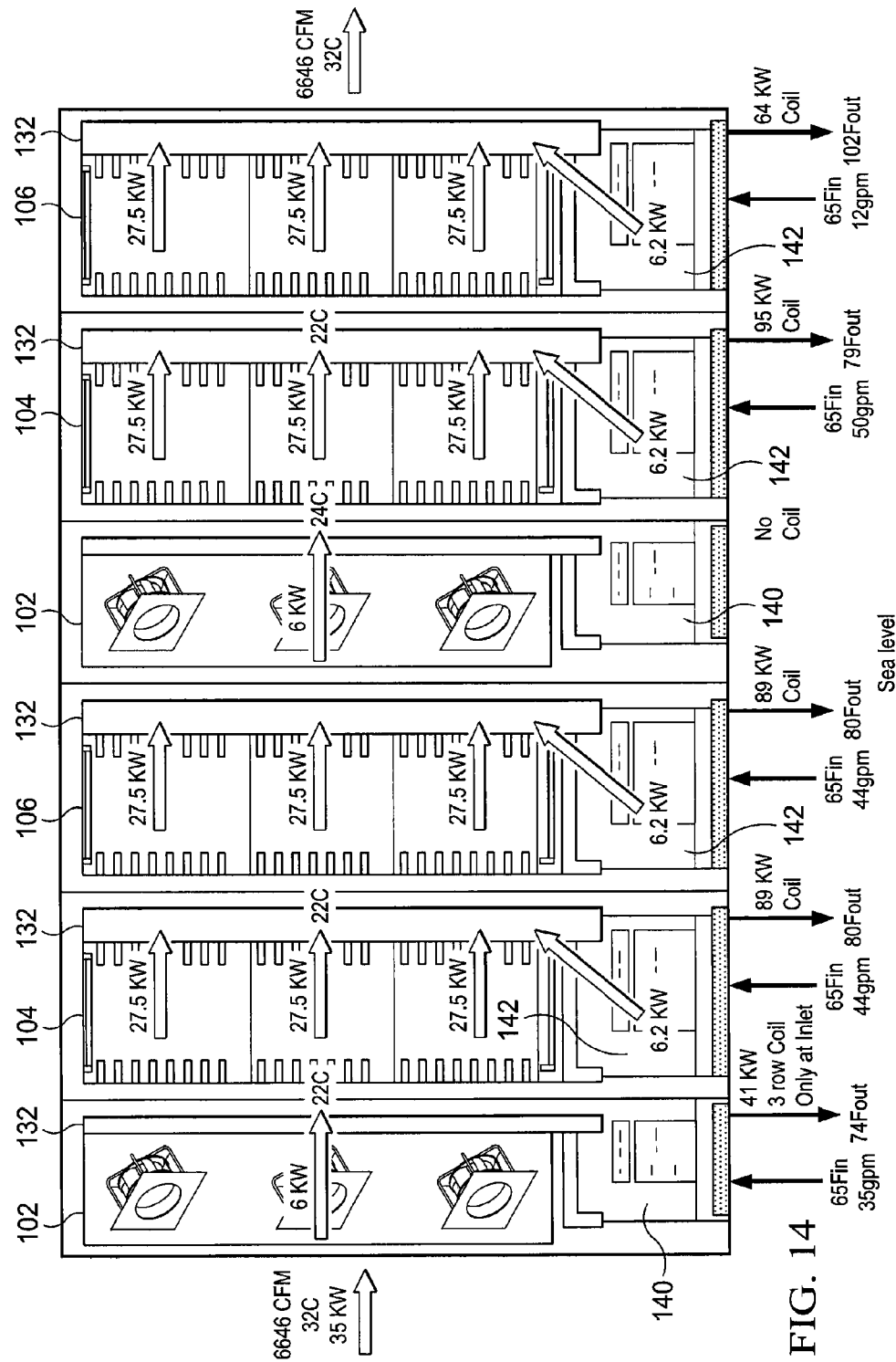

FIGS. 13 and 14 depict a pair of serially positioned electronics systems 160 of FIG. 6, in two different room neutral conditions. In the example embodiment shown in FIG. 13, the air entering blower system 102 is at 22° C., sea level, and intercoolers 132, chassis backplane coils 212, and power supply coils 214 each operate such that the collective systems 160 expel air to the ambient at 22° C., such that the complete system is room neutral. As shown, the temperature of the cooling fluid provided to each coil is 45° F., and the associated return fluid temperature of each coil and the fluid flow rate is shown. In the example shown in FIG. 14, the ambient room temperature is 32° C., sea level, and thus the fluid flow rates to the various coils are increased to maintain a room neutral system, as shown.

In the examples shown in FIGS. 13 and 14, there is no intercooler 132 to the right of the right blower 102, because there is an intercooler 132 to the left of the right blower 102, although the intercooler associated with the right blower 102 could be positioned to the right thereof if desired.

In the examples shown in FIGS. 13 and 14, the power supply coils 214 remove heat generated by the respective power supplies 114 such that the power supplies 114 don't contribute heat to the heat generated by electronics assemblies 192 above. Advantageously, this modular cooling design is configured such that the electronics assemblies 192 are thermally isolated from the power supplies 114.

In the various embodiments, a temperature sensor is positioned on or proximate on each electronics assembly 192 and used to determine the adequate flow of cooling fluid into associated intercooler 132. The controller 210 variably and responsively controls the respective valves 206 and 232 such that the thermal gradients of the respective cooling coils achieve the desired cooling. In one embodiment, the respective system may apply direct enough cooling fluid to maintain the temperature of the air exiting each intercooler at the temperature of the air going into the previous component. In another embodiment, the respective system may apply only enough water to maintain the temperature of the air exiting one or more intercoolers at a predetermined temperature higher or lower that the temperature of the air going into the previous component.

One advantage of transverse cooling is that the heat added by each cabinet is extracted soon after the air leaves the cabinet. In the examples shown in FIGS. 3, 4, 5, 6 and 11-13, the heat is extracted by an intercooler 132 as soon as the air leaves the respective cabinet. In the examples shown in FIGS. 7 and 8, the heat is extracted by an intercooler 132 as soon as the air leaves the second cabinet 106. As a result, the air exiting from each system is at or around the same temperature that it was when entering system, thus room neutral. The air leaving the system can, therefore, be used to cool the next cabinet to realize a significantly large electronics system.

Figure 15:
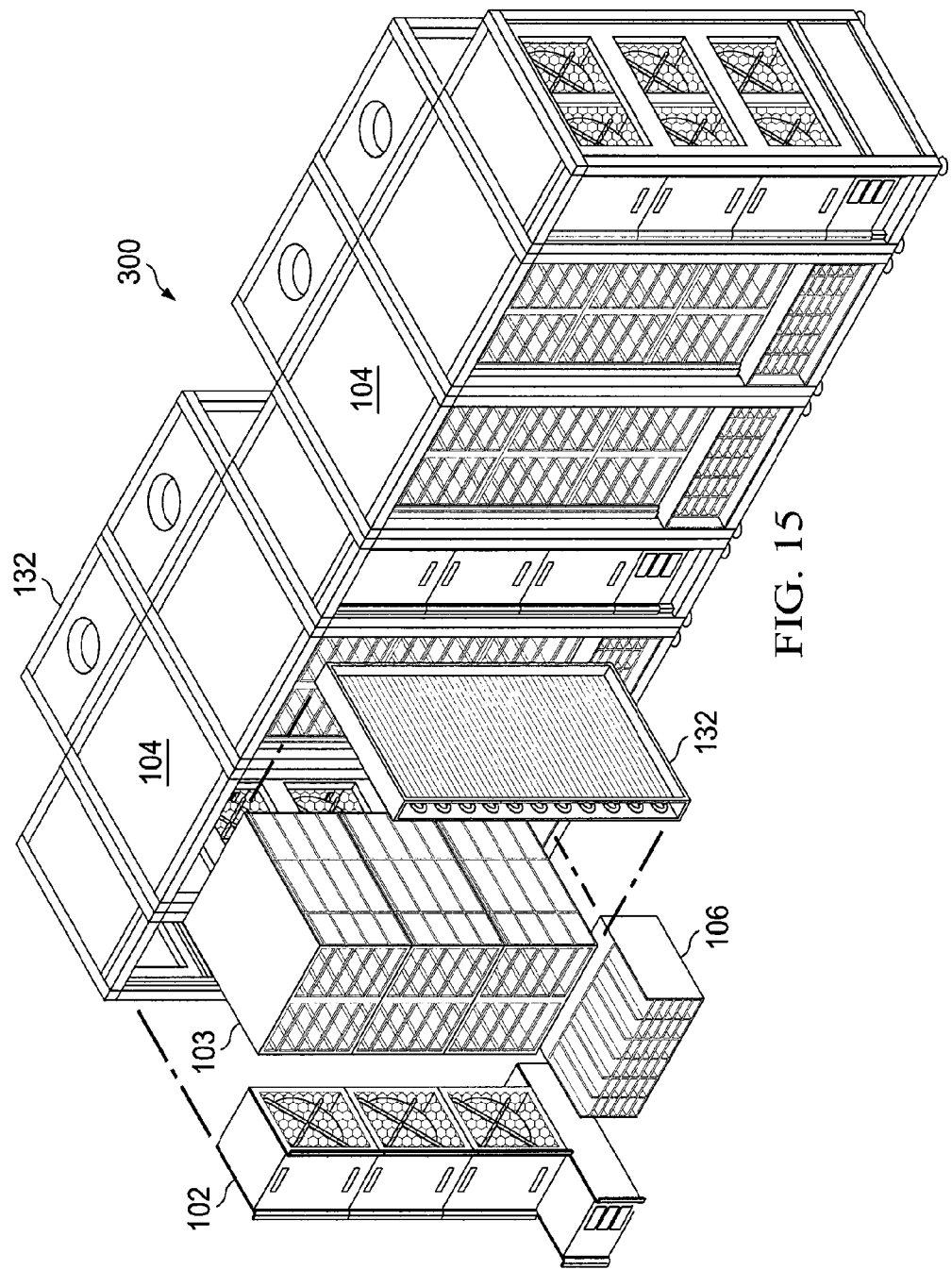
FIG. 15 illustrates an embodiment of a multi-cabinet electronics system with transverse cooling.

An example of a larger-scaled room neutral electronics system 300 comprising a single row of cabinets is shown in FIG. 15, with various components labeled for illustration. A main cooling fluid supply line 302 is shown which feeds each cabinet water inlet 202 is shown.

Figure 16:
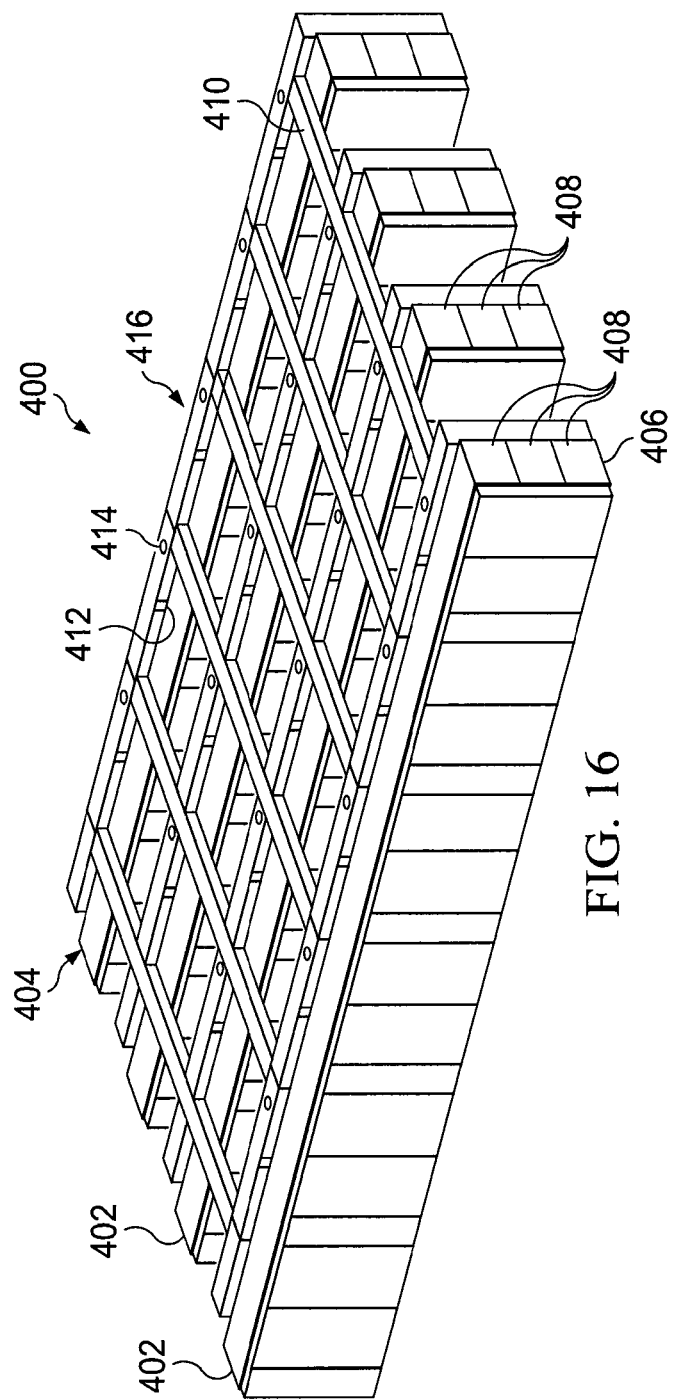
FIGS. 16 and 17 illustrate example embodiments of larger multi-cabinet electronics systems with transverse cooling.

An even larger scaled electronics system 400 with multiple rows of cabinets is shown in FIG. 16. In the example shown in FIG. 16, the computer cabinets, i.e. cabinets 104 and 106, are placed side-by-side to form a row of cabinets 402, and the rows of cabinets 402 are arranged to form an array of cabinets 404. Air is directed into a first one of the cabinets 406 in each row and flows from cabinet to cabinet down the row. In the example shown in FIG. 16, a blower intercooler combination as is shown in FIGS. 5, 6, 8, 10, 11, 12 and 13 is used to cool air received from an air intake 408 before directing the air into the row of cabinets. Water lines 302 supply water to each computer cabinet and are controlled to cool air leaving each computer cabinet to approximately the same temperature it had when entering cabinet.

Cable trays 410 carry cables connecting cabinets to cabinets in other rows. Cable access openings 412 and cable exit ports 414 are used to direct and protect cables passing between rows. Air mover racks are shown at 416.

Figure 17:
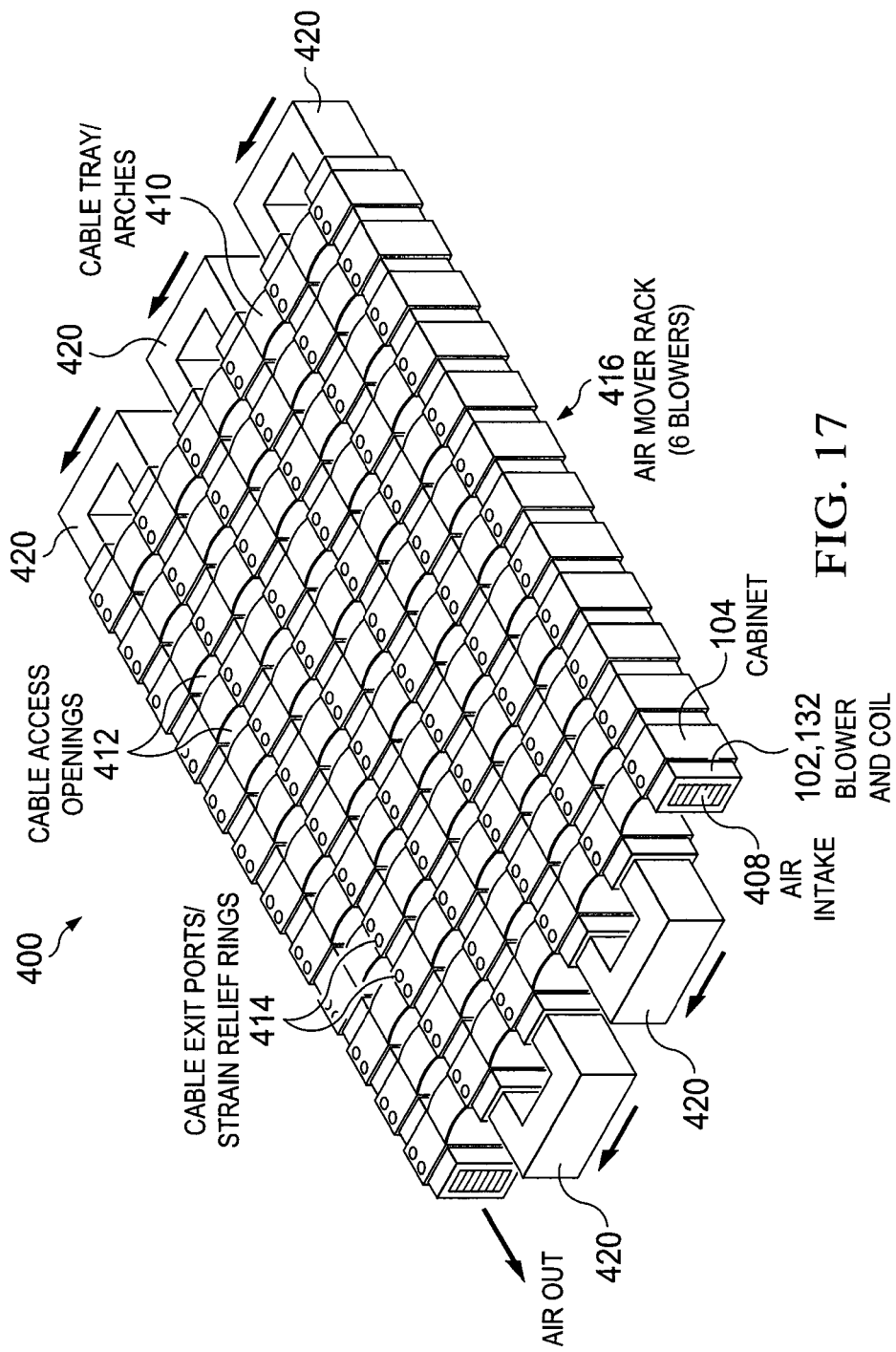

In one embodiment, an air curtain or ducting forms an air redirector 420 used to move air flowing from one row of cabinets 402 to the next row of cabinets 402, such as in a serpentine arrangement as shown in FIG. 17. In one embodiment, the systems include N+1 blower systems 102 for system configurations of N cabinets, where N is less than or equal to 6. One of the blower systems is configured as an exhaust blower cabinet.

In another embodiment, the systems include N+1 blower systems 102 for system configurations of N cabinets, where there are N cabinets in a row and where N is greater than or equal to 10. In configurations where an exhaust blower cabinet is needed, N+2 blower systems are used.

In one embodiment, the systems include sensors for monitoring system thermal conditions. In one such embodiment, the systems monitor ambient air temperature, ambient relative humidity, ambient dew point, blower status, air velocity and temperature of the air exiting intercooler assembly 132, water coil inlet water temperature, water pressure differential across the water coil, water coil outlet air temperature and water detection both in the pre-conditioner and in computer cabinet. In one embodiment, the controls include front end rectifier power good indication.

In one embodiment, the systems use water valves to control coil water flow and air exhaust temperature, to precondition incoming air and to maintain room neutral exhaust temperatures.

In one embodiment, the controllers 210 vary blower cabinet fan speed as needed. In one such embodiment, the systems increase fan speed upon fan failure to maintain air velocity. In another embodiment, the systems increase fan speed to maintain chip temperatures in electronics assemblies 192. If chip temperature exceeds a set value, the respective water valve is opened to bring the chip temperature down. If that doesn't work by itself, then the fan speed can be increased to 100% full speed.

The above described transverse cooling system and method is advantageous since it reuses air as that air passes through each cabinet. The increased cross-sectional area and the decreased pressure drop means that this method is a more efficient way of removing heat from the system. The increased cross-sectional area means that more fans can be placed in parallel. This, in turn, reduces the cost of the fans, as industry standard fans can be used instead of custom fans. It also reduces the effects of loss of a fan in blower system 102.

In addition, since, in some embodiments, air exiting each cabinet is around the same temperature as entering the cabinet, similar cabinets 104 should exhibit similar thermal profiles and have similar energy utilization. That is, the cooling system is room neutral. Unconditioned and unfiltered air can be used.

Transverse cooling shows a dramatic increase in cooling efficiency. In one example embodiment, cooling energy dropped to 3% of total system power. This approach eliminates the need for conditioning and filtering air in the room in which systems are placed, relaxing computer room environmental requirements. The increased cross-sectional area of air flow reduces the effect of failures in any one fan, or in any one component of the cooling system, increasing system reliability.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A room neutral system for managing heat generated within an electronics cabinet so that temperature within the room is unaffected, the system comprising;
   at least one cabinet having a base, a first vertically extending side and an opposing second vertical extending side, the at least one cabinet configured to receive a plurality of electronic assemblies, wherein the cabinet is further configured to receive air from the first vertically extending side and expel air through the second vertically extending side and wherein the electronics assemblies are positioned substantially in-line with the first vertically extending side and the second vertically extending side;
   a power unit configured to supply electrical power to the electrical assemblies;
   a blower assembly positioned in line with the flow of air and configured to direct a flow of air into the first said cabinet side and transversely across the plurality of electronics assemblies in a substantial horizontal direction;
   a first intercooler positioned in line with the flow of air and downstream from the electronics assemblies, the first intercooler positioned to have the flow of air directed there through such that the first intercooler will extract heat in the air generated by the electronics assemblies;
   a second intercooler configured to remove heat generated by the power unit; and
   a controller configured to control the blower, the first intercooler and the second intercooler such that a temperature of air drawn into the system is generally the same as a temperature of the air expelled from the system.

2. The system of claim 1 further comprising at least one chassis backplane configured to interconnect to the plurality of electronics assemblies wherein the at least one chassis backplane has a third intercooler configured to remove heat generated by the electronics assemblies, and wherein the controller is configured to control the third intercooler.

3. The system of claim 2 further comprising a plurality of said chassis backplanes, wherein each said chassis backplane has a third intercooler configured to remove heat generated by the associated electronics assemblies.

4. The system of claim 1 wherein the controller selectively controls fluid flow through the first intercooler to thus selectively control the temperature of air expelled therefrom.

5. The system of claim 1 further comprising at least one valve selectively controllable by the controller and which variably controls a fluid rate of fluid directed through each of the first intercooler and the second intercooler.

6. The system of claim 1 further comprising the plurality of electronics assemblies horizontal disposed in the cabinet.

7. The system of claim 1 further comprising a plurality of said cabinets including a first cabinet configured to direct the expelled air into a second said cabinet wherein the first intercooler and blower are controlled by the controller such that a temperature of air drawn into the system and directed into the first said cabinet is generally the same as a temperature of the air expelled from the second side of the second cabinet.

8. The system of claim 7 wherein the first intercooler is disposed between the first cabinet and the second cabinet.

9. The system of claim 7 further comprising a third intercooler disposed between the blower assembly and the first cabinet.

10. The system of claim 7 wherein the blower is positioned adjacent to the first cabinet and directed to generate airflow into the first cabinet.

11. The system of claim 1 further comprising a chassis backplane having a backplane intercooler configured to remove heat generated by the electronic assemblies.

12. A room neutral system for managing heat generated by an electronics system having a plurality of electronic assemblies so that the temperature within the room is substantially unaffected, the system comprising:
- a first cabinet and a second cabinet, each cabinet having a base and a first vertically extending side and an opposing vertically extending side, wherein each cabinet is configured to receive air from said first said side and expel air through said opposing side creating an internal airflow, each cabinet further configured to receive a plurality of electronics assemblies and position the electronics assemblies substantially in-line between the first said side and said opposing side, thus allowing a flow of air to move across the electronic assemblies;
- a power unit configured to power the electronics assemblies;
- a blower assembly configured to generate the flow of air and direct the flow of air into each of the first said cabinet sides and configured to cause the air to flow across the plurality of electronics assemblies contained within the first cabinet and the second cabinet in a substantial horizontal direction;
- a first intercooler disposed in line with the flow of air and configured to cause the flow of air to be directed there through and to extract heat in the air;
- a second intercooler configured to remove heat generated by the power unit; and
- a controller configured to control the blower, the first intercooler and the second intercooler such that a temperature of air drawn into the system is generally the same as a temperature of the air expelled from the system, thus causing a neutral effect on a temperature of the room containing the system.

13. The system of claim 12 further comprising of a third intercooler disposed in line with the airflow path, wherein the third intercooler is also controlled by the controller to maintain the neutral effect on room temperature.

14. The system of claim 13 further comprising a plurality of chassis backplanes wherein each said chassis backplane has a fourth intercooler configured to remove heat generated by the electronics assemblies associated with said plurality of chassis backplanes.

15. The system of claim 12 wherein:
the power unit is disposed in a lower portion of the at least the first cabinet or the second cabinet.

16. The system of claim 12, further comprising at least one chassis back plane configured to interconnect to the plurality of electronics assemblies, wherein the at least one chassis backplane has a backplane intercooler configured to remove heat generated by the electronics assemblies.

* * * * *